(12) United States Patent
Kim

(10) Patent No.: US 8,178,441 B2
(45) Date of Patent: May 15, 2012

(54) SEMICONDUCTOR DEVICE AND METHOD FOR MANUFACTURING THE SAME

(75) Inventor: Seok-Su Kim, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1374 days.

(21) Appl. No.: 11/186,396

(22) Filed: Jul. 21, 2005

(65) Prior Publication Data

US 2006/0017116 A1     Jan. 26, 2006

(30) Foreign Application Priority Data

Jul. 26, 2004  (KR) ........................ 10-2004-0058190

(51) Int. Cl.
*H01L 21/44*  (2006.01)
*H01L 21/4763*  (2006.01)

(52) U.S. Cl. .. 438/652; 438/675; 438/597; 257/E21.585

(58) Field of Classification Search .................. 438/637, 438/675, 652, 597, E21.585; 257/774, 750
See application file for complete search history.

(56) References Cited

U.S. PATENT DOCUMENTS

| | | | |
|---|---|---|---|
| 5,858,837 A * | 1/1999 | Sakoh et al. ................... | 438/255 |
| 6,030,894 A * | 2/2000 | Hada et al. ..................... | 438/675 |
| 6,107,182 A * | 8/2000 | Asahina et al. ................ | 438/618 |
| 6,287,905 B2 | 9/2001 | Kim et al. | |
| 6,432,816 B2 | 8/2002 | Kim et al. | |
| 6,472,303 B1 * | 10/2002 | Weon et al. ................... | 438/597 |
| 6,869,874 B2 * | 3/2005 | Kim et al. ...................... | 438/652 |
| 6,881,659 B2 * | 4/2005 | Park et al. ...................... | 438/618 |
| 7,052,983 B2 * | 5/2006 | Park et al. ...................... | 438/607 |
| 7,153,753 B2 * | 12/2006 | Forbes ........................... | 438/404 |
| 2001/0005614 A1 | 6/2001 | Kim et al. | |
| 2001/0005626 A1 | 6/2001 | Kim et al. | |
| 2003/0087512 A1 * | 5/2003 | Cheong .......................... | 438/595 |
| 2003/0124465 A1 * | 7/2003 | Lee et al. ....................... | 430/314 |
| 2004/0102039 A1 * | 5/2004 | Lim et al. ...................... | 438/674 |

FOREIGN PATENT DOCUMENTS

KR    10-1998-0055929    9/1998
(Continued)

OTHER PUBLICATIONS

Kim, Ji Yeong, Contact Plug Structure of Semiconductor Device and Forming Method Thereof, English Abstract of Korean Patent Abstract 1020040029539 A, Apr. 8, 2004, Korean Intellectual Property Office, Republic of Korea.

(Continued)

*Primary Examiner* — Nitin Parekh
(74) *Attorney, Agent, or Firm* — The Law Offices of Andrew D. Fortney; Andrew D. Fortney

(57) ABSTRACT

A method for manufacturing a semiconductor device includes forming a gate insulating layer, a gate and a protective layer on a semiconductor substrate, forming a spacer on lateral sides of the protective layer and the gate, forming one or more junction regions in the semiconductor substrate at sides of the gate, partially filling a gap between adjacent gates by selectively forming a conductive layer on an exposed portion of the semiconductor substrate between the adjacent gates, forming an insulating layer over the semiconductor substrate so as to fill a full height of the gap between the adjacent gates, and forming a contact hole partially exposing the conductive layer by etching the insulating layer.

13 Claims, 4 Drawing Sheets

FOREIGN PATENT DOCUMENTS

| KR | 1019980055929 A | 9/1998 |
|---|---|---|
| KR | 10-2001-0063762 | 7/2001 |
| KR | 2001-0063759 | 7/2001 |
| KR | 1020010063759 A | 7/2001 |
| KR | 1020010063762 A | 7/2001 |
| KR | 1020040029539 A | 4/2004 |

OTHER PUBLICATIONS

Kim, Jeong Ho et al., Method for Fabricating Semiconductor Device, English Abstract of Korean Patent Abstract 1020010063762 A, Jul. 9, 2001, Korean Intellectual Property Office, Republic of Korea.

Kim, Jeong Ho et al., Method for Manufacturing Semiconductor Device, English Abstract of Korean Patent Abstract 1020010063759 A, Jul. 9, 2001, Korean Intellectual Property Office, Republic of Korea.

Lee, Young-Cheol et al., Method of Forming Contact Hole in Semiconductor Device, English Abstract of Korean Patent Abstract 101998055929 A, Sep. 25, 2001, Korean Intellectual Property Office, Republic of Korea.

Fabricating Method for Semiconductor Device; Korean Abstract of Korean Patent Registration No. KR 10-0474546 in U.S. Appl. No. 11/186,397 corresponding to Korean Patent Publication No. 10-2001-0063762.

Jeong Ho Kim and Yeong Seo Kim; Method for Fabrication Semiconductor Device; iesp@cenet; Publication No. KR20010063762; Publication Date; Jul. 9, 2001; esp@cenet data base, Worldwide: http://v3.espacenet.com/textdoc?DB=EPODOC &IDX=KR20010063.

Yeong Cheol Lee and Jeong Seok Lee; Method for Forming Contact Hole of Semiconductor Device; esp@cenet; Publication No. KR100426490B; Publication Date: Mar. 29, 2004; esp@cenet data base, Worldwide; http://v3.espacenet.com/textdoc?DB=EPODOC &IDX=KR100426490B&F=0.

Fabricating Method for Semiconductor Device; Korean Abstract of Korean Patent Registration No. KR 10-0535030 in U.S. Appl. No. 11/186,397 corresponding to Korean Patent Publication No. 10-2001-0063759.

Jeong Ho Kim and Jae Seon Yoo; Method for Manufacturing Semiconductor Device; esp@cenet Publication No. KR20010063759; Publication Date: Jul. 9, 2001; esp@cenet data base, Worldwide; http://v3.espacenet.com/textdoc?DB=EPODOC &IDX=KR20010016375.

\* cited by examiner

SEMICONDUCTOR DEVICE AND METHOD FOR MANUFACTURING THE SAME

CROSS-REFERENCE TO RELATED APPLICATIONS

This application claims priority to and the benefit of Korean Patent Application 10-2004-0058190 filed in the Korean Intellectual Property Office on Jul. 26, 2004, the entire contents of which are incorporated herein by reference. Furthermore, this application may be related to U.S. application Ser. No. 11/186,397, filed contemporaneously herewith and incorporated herein by reference in its entirety.

BACKGROUND OF THE INVENTION (a) Field of the Invention

The present invention relates to a semiconductor device and a method for manufacturing the same. More particularly, the present invention relates to a wire, contact or contact hole of a semiconductor device and a method for manufacturing the same.

(b) Description of the Related Art

Typically, a semiconductor device is insulated from another semiconductor device or an exterior circuit. For an electrical connection thereof, a contact hole is formed in an insulating layer, and a conductive material such as a metal fills the contact hole.

However, integrated circuit design rules decrease as integration of semiconductor devices increases, and thus, gaps between semiconductor device (or integrated circuit) patterns are reduced. Accordingly, a gap filling characteristic of an interlayer insulating layer that insulates one pattern from another becomes more important. Accordingly, a flowable insulating layer such as a borophosphosillcate glass (BPSG) layer or a phosphosilicate glass (PSG) layer is typically used as the interlayer insulating layer.

Hereinafter, a conventional method for forming a wire or contact hole using such an interlayer insulating layer will be described in detail with reference to FIG. 1, FIG. 2A, and FIG. 2B.

Firstly, as shown in FIG. 2A (and in part in FIG. 1), a gate insulating layer 11, a gate 12, and an insulating spacer 13 are formed above a semiconductor substrate 10, and a source/drain junction region 14 is formed in the substrate 10. Then, a flowable interlayer insulating layer 15 such as a BPSG layer or a PSG layer is formed over the substrate so as to fill the gap between the gate 12 and the adjacent gate 17.

Subsequently, as shown in FIG. 2B (and in part in FIG. 1), the interlayer insulating layer 15 is etched to form a contact hole 16 partially exposing the junction region 14. In this case, the etching of the interlayer insulating layer 15 is performed such that contact hole 16 has an overcut etch profile and becomes fully open.

Subsequently, although not shown, a conductive material such as a metal is deposited on the interlayer insulating layer 15 so as to fill the contact hole 16, and the conductive material is patterned such that a wire contacting the junction region 14 may be formed.

However, as the integration of semiconductor devices becomes higher, the gap between the gates 12 and 17 becomes narrower. Therefore, an aspect ratio of the gap becomes bigger, that is, a height D1 of the gap becomes relatively larger than a width thereof. Consequently, even if a flowable insulating layer such as a BPSG layer or a PSG layer is used to form the interlayer insulating layer 15, the gap between the gates 12 may not be fully filled with the interlayer insulating layer 15, and a void 100 may occur in the interlayer insulating layer 15, as shown in FIG. 2A In addition, since the contact hole has an overcut profile, the thickness D2 from the contact surface at the bottom of the contact hole 16 to a bottom of the junction region 14 is decreased as shown in FIG. 2B. In this case, a contact resistance characteristic of a wire may become problematic, The above information disclosed in this background section is only for enhancement of understanding of the background of the invention and therefore, it may contain information that does not form information (e.g., prior art) that may be already known in this or any other country to a person or ordinary skill in the art

SUMMARY OF THE INVENTION

The present invention has been made in an effort to prevent voids by enhancing a gap filling characteristic of an interlayer insulating layer, and enhancing a contact resistance characteristic of a wire at the same time.

An exemplary semiconductor device according to an embodiment of the present invention includes a semiconductor substrate, a gate and a gate insulating layer on the semiconductor substrate, a protective layer above the gate, a spacer on lateral sides of the gate, a conductive layer on an exposed portion of the semiconductor substrate between adjacent gates and partially filling a gap between the adjacent gates, and an insulating layer over the semiconductor substrate and filling a full height of the gap between the adjacent gates, having a contact hole therein partially exposing the conductive layer.

An exemplary method for manufacturing a semiconductor device according to an embodiment of the present invention includes forming a gate insulating layer, a gate and a protective layer on a semiconductor substrate, forming a spacer on lateral sides of the protective layer and the gate, forming a junction region in the semiconductor substrate at sides of the gate and/or spacer, partially filling a gap between adjacent gates by selectively forming a conductive layer on an exposed portion of the semiconductor substrate between the gates, forming an insulating layer over the semiconductor substrate so as to fill a full height of the gap between the gates, and forming a contact hole partially exposing the conductive layer by etching the insulating layer.

In a further embodiment, the protective layer comprises an oxide layer or a nitride layer.

In a further embodiment, the conductive layer is thicker than the protective layer.

In a further embodiment, the conductive layer comprises a silicon layer.

In a further embodiment, forming the silicon layer comprises epitaxially growing the silicon layer.

In a further embodiment, the contact hole has an overcut profile.

DETAILED DESCRIPTION OF THE EMBODIMENTS

An embodiment of the present invention will hereinafter be described in detail with reference to the accompanying drawings.

Hereinafter, a method for forming a wire of a semiconductor device according to an exemplary embodiment of the present invention will be described in detail with reference to FIG. 3A to FIG. 3E.

Figure 3A:
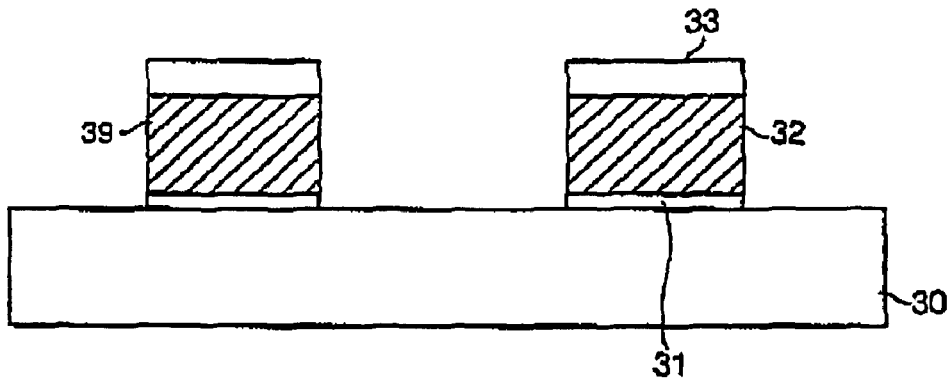
FIG. 3A to FIG. 3E are sectional views of FIG. 1 along a line A-A', showing sequential stages of a method for forming a contact hole and/or wire of a semiconductor device according to an exemplary embodiment of the present invention.

As shown in FIG. 3A a gate insulating layer 31 is formed on a semiconductor substrate 30 comprising, e.g., silicon, and a gate material layer such as a polysilicon layer and a protective material layer such as a nitride layer or an oxide layer are sequentially deposited on the insulating layer 31. Subsequently, a protective layer 33 and a gate 32 (and an adjacent gate 39) are formed by patterning the protective material layer and the gate material layer by a photolithography and etching process. The protective layer 33 prevents growth of silicon on the gate 32 (and on adjacent gate 37) during a selective epitaxial growth (SEG) process that may be later performed.

Figure 3B:
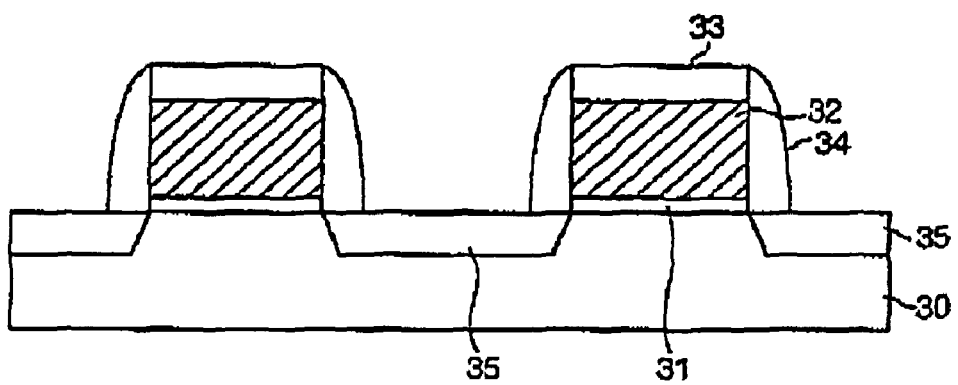

As shown in FIG. 3B, a spacer 34 comprising an insulating material is formed at respective side walls of the gate 32 and the protective layer 33, and impurity ions are implanted into the substrate 30 so as to form source/drain junction regions 35 therein at the both sides of the gate 32. An identical spacer may be formed at the sides of the gate 39 at the same time as spacer 34. Also, in one alternative, prior to forming the spacer 34, conventional LDD regions may be formed in the substrate 30 by ion implantation.

Figure 3C:
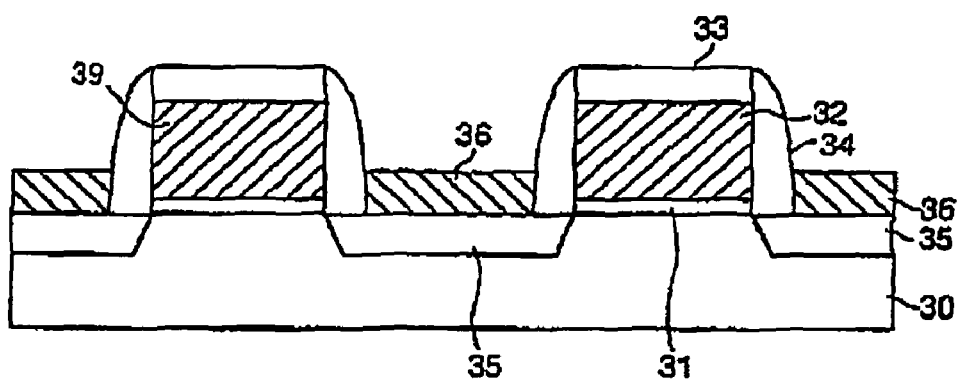

As shown in FIG. 3C, a silicon layer 3B is epitaxially grown on the exposed junction region 34. Thus, in one embodiment, a SEG process is performed, and thereby gaps between the gates 32 and 39 are partially filled by selectively forming a conductive (e.g., a silicon) layer 36 only on exposed portions of the substrate 30 between the gates 32 and 39. In this case, the silicon layer 36 may be thicker than the protective layer 33, thereby reducing a height of the gap between the gates 32 and 39.

Figure 1:
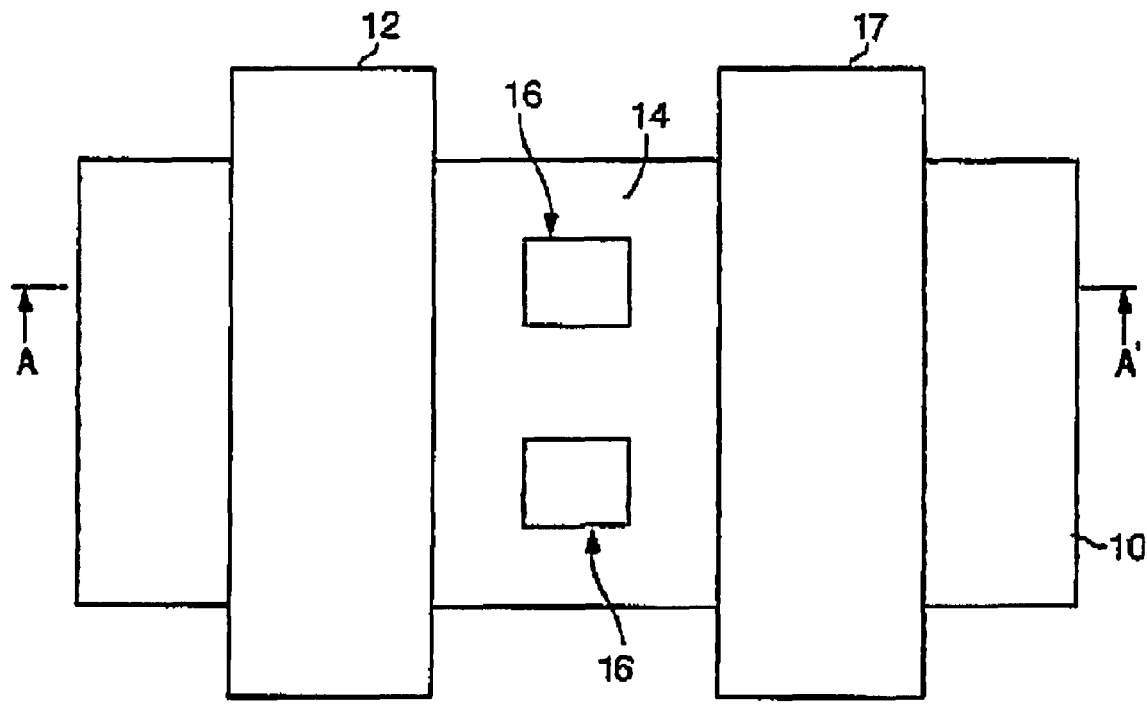
FIG. 1 is a top plan view of a semiconductor device after forming a contact hole according to a conventional method and according to an exemplary embodiment of the present invention.
Figure 2A:
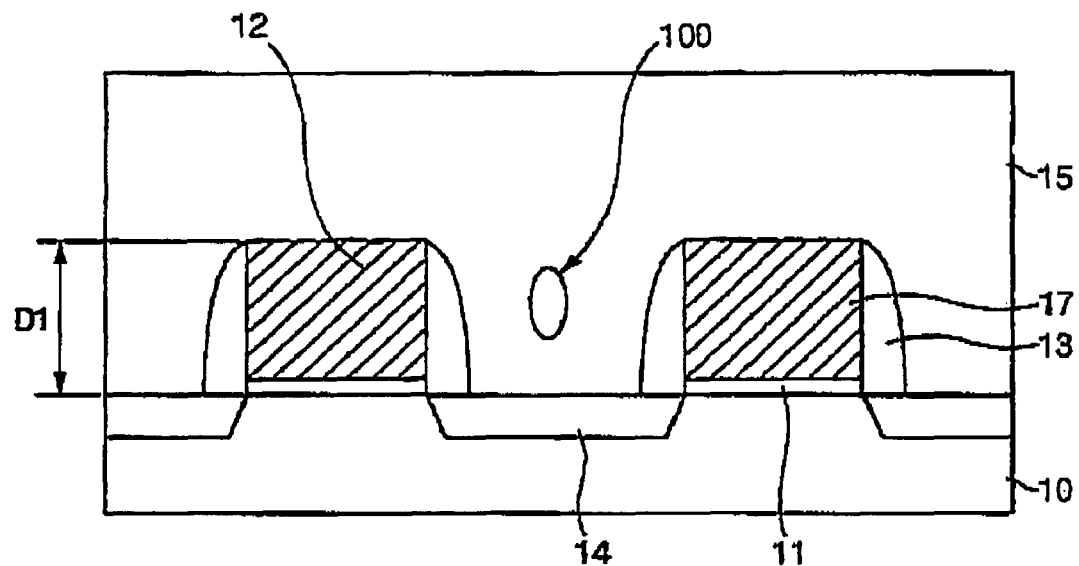
FIG. 2A and FIG. 2B are respectively sectional views of FIG. 1 along a line A-A' for a semiconductor device manufactured according to a conventional method.
Figure 3D:
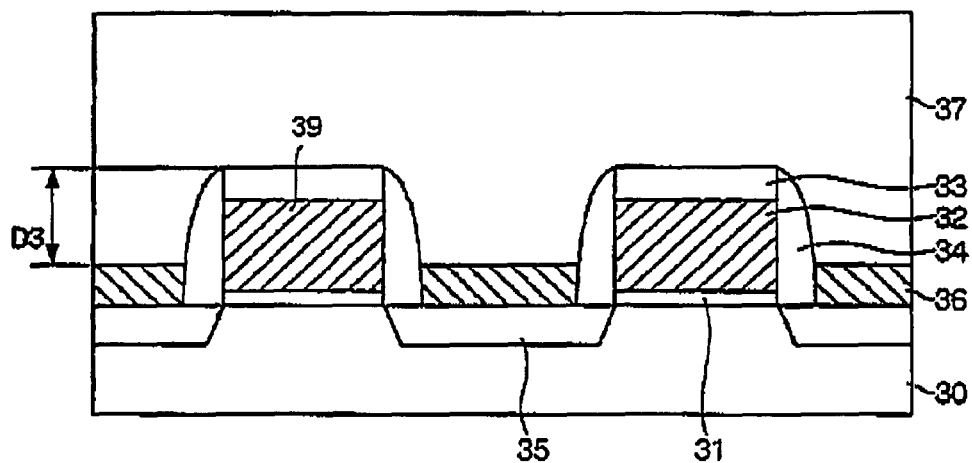

Subsequently, as shown in FIG. 3D a flowable interlayer insulating layer 37 is formed on the substrate 30 such as a BPSG layer or a PSG layer, such that a full height of the gap between the gates 32 and 39 may be completely filled. At this time, the height of the gap between the gates 32 and 39 is reduced to D3 from a conventional height D1 (refer to FIG. 2A) due to the silicon layer 36, and accordingly, a gap filling characteristic of the interlayer insulating layer 37 is enhanced to prevent (or reduce a likelihood of forming) a void.

Figure 2B:
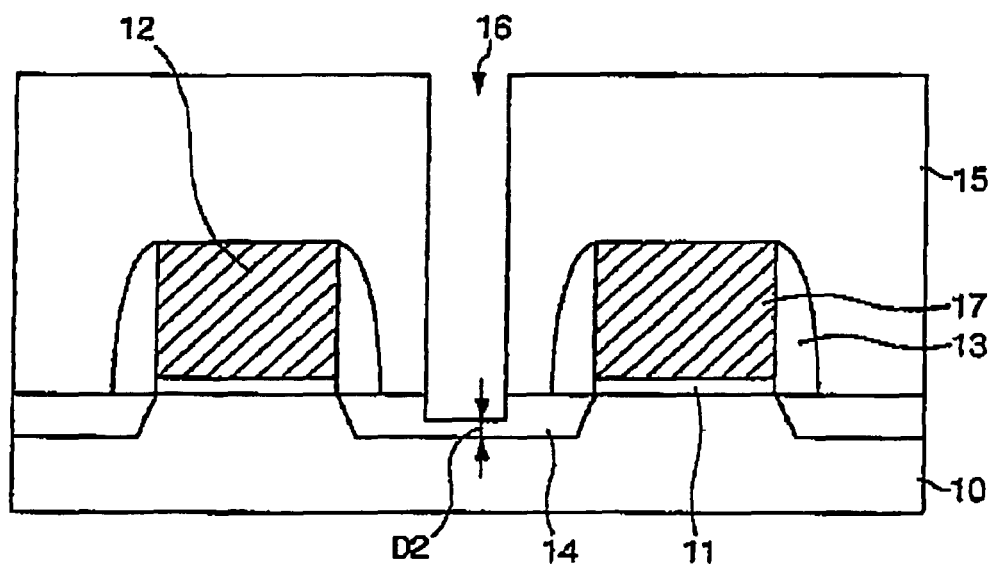
Figure 3E:
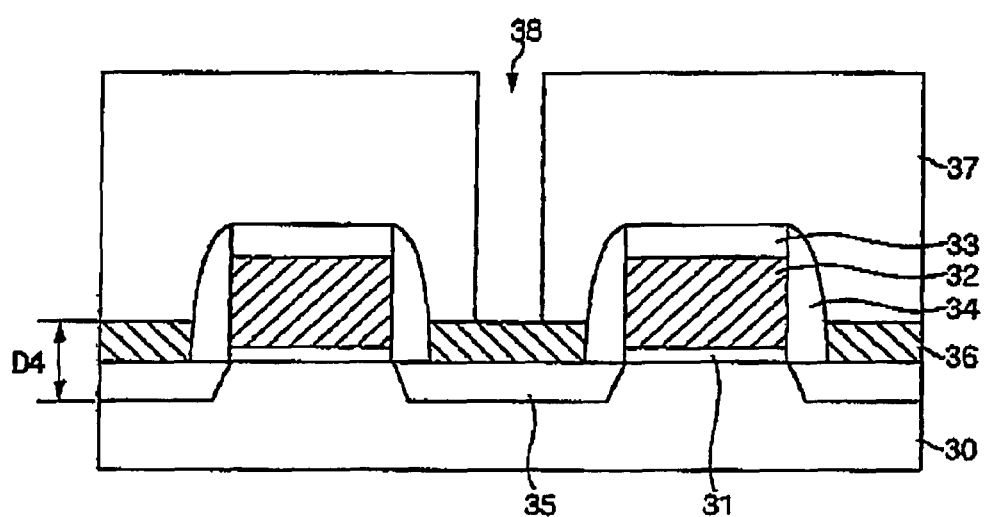

Subsequently, as shown in FIG. 3E, the interlayer insulating layer 37 is etched to form a contact hole 38 that partially exposes the silicon layer 36. At this time, the etching is performed such that the contact hole 38 has an overcut profile and becomes completely open. However, the thickness D4 from the contact surface at the bottom of the contact hole 38 to a bottom of the junction region 35 is to larger than the conventional level D2 (refer to FIG. 2B) due to the silicon layer 36, thereby reducing or preventing deterioration of a contact resistance characteristic of a wire.

Subsequently, although not shown, a conductive material such as a metal is deposited on the interlayer insulating layer 37 so as to fill the contact hole 38, and the conductive material is patterned or polished such that a wire contacting the junction region 35 may be formed.

As described above, according to an exemplary embodiment of the present invention, prior to forming an interlayer insulating layer, a silicon or other conductive layer is selectively formed on an exposed portion of a substrate between the gates by epitaxy (e.g., performing a SEG process). Accordingly, since the height of a gap between gates is reduced, a gap filling characteristic of an insulating layer is enhanced, thereby preventing or reducing the incidence of voids.

In addition, a thickness from a contact surface at the bottom of a contact hole to the bottom of a junction region may be increased sufficiently to enhance or improve a contact resistance characteristic of a wire to the junction region. Consequently, semiconductor device yields and reliability may be enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a semiconductor device comprising:
   forming a gate insulating layer, a gate and a protective layer on a semiconductor substrate;
   forming a spacer on lateral sides of the protective layer and the gate to completely cover lateral sides of the protective layer and the gate;
   forming a junction region in the semiconductor substrate at sides of the gate and/or spacer;
   partially filling a gap between gates by selectively forming a silicon layer on an exposed portion of the semiconductor substrate between the spacers sufficiently to reduce formation of voids in a subsequently formed insulating layer, wherein the silicon layer is thicker than the protective layer;
   forming the insulating layer on the silicon layer, the spacers, and over the semiconductor substrate so as to fill a full height of the gap, and
   forming a contact hole partially exposing the silicon layer by etching the insulating layer such that the spacers remain covered by the insulating layer.

2. The method of claim 1, wherein the protective layer comprises an oxide layer or a nitride layer.

3. The method of claim 2, wherein forming the silicon layer comprises epitaxially growing the silicon layer.

4. The method of claim 2, wherein the insulating layer comprises a borophosphosilicate glass (BPSG) layer or a phosphosilicate glass (PSG) layer.

5. The method of claim 2, further comprising depositing a second conductive material on the insulating layer so as to fill the contact hole.

6. The method of claim 5, wherein the conductive material comprises metal.

7. The method of claim 6, further comprising patterning or polishing the second conductive material, thereby forming a wire contacting the junction region.

8. The method of claim 1, wherein forming the silicon layer comprises epitaxially growing the silicon layer.

9. The method of claim 1, wherein the contact hole has an overcut profile.

10. The method of claim 1, wherein the insulating layer comprises a borophosphosilicate glass (BPSG) layer or a phosphosilicate glass (PSG) layer.

11. The method of claim 1, further comprising depositing a second conductive material on the insulating layer so as to fill the contact hole.

12. The method of claim 11, wherein the conductive material comprises metal.

13. The method of claim 11, further comprising patterning or polishing the second conductive material, thereby forming a wire contacting the junction region.

* * * * *